United States Patent
Lee et al.

(10) Patent No.: US 10,777,777 B2
(45) Date of Patent: Sep. 15, 2020

(54) PASSIVATION FILM DEPOSITION METHOD FOR LIGHT-EMITTING DIODE

(71) Applicant: TES CO., LTD, Yongin, Gyeonggi-do (KR)

(72) Inventors: Hong-Jae Lee, Gyeonggi-do (KR); Jong-Hwan Kim, Chungcheongnam-do (KR); Woo-Pil Shim, Gyeonggi-do (KR); Woo-Jin Lee, Busan (KR); Sung-Yean Yoon, Gyeonggi-do (KR); Don-Hee Lee, Gyeonggi-do (KR)

(73) Assignee: TES CO., LTD, Yongin, Gyeonggi-do (KR)

( * ) Notice: Subject to any disclaimer, the term of this patent is extended or adjusted under 35 U.S.C. 154(b) by 0 days.

(21) Appl. No.: 16/124,475

(22) Filed: Sep. 7, 2018

(65) Prior Publication Data
US 2019/0019996 A1    Jan. 17, 2019

Related U.S. Application Data

(63) Continuation of application No. PCT/KR2017/002470, filed on Mar. 7, 2017.

(30) Foreign Application Priority Data

Mar. 8, 2016  (KR) .................. 10-2016-0027868

(51) Int. Cl.
*H01L 21/00*   (2006.01)
*H01L 51/56*   (2006.01)
*H01L 51/52*   (2006.01)

(52) U.S. Cl.
CPC .......... *H01L 51/56* (2013.01); *H01L 51/5237* (2013.01); *H01L 51/5253* (2013.01); *H01L 2251/301* (2013.01); *H01L 2251/558* (2013.01)

(58) Field of Classification Search
CPC ......... H01L 51/56; H01L 21/02; H01L 51/00; H01L 51/52; H01L 51/5237; H01L 2251/301; H01L 2251/558
See application file for complete search history.

(56) References Cited

U.S. PATENT DOCUMENTS 8,916,397 B2 * 12/2014 Schmid ............... C23C 16/0272
                                                            438/26
2009/0162949 A1    6/2009   Takagi et al.
(Continued)

FOREIGN PATENT DOCUMENTS

CN          101465322 A      6/2009
KR     10-2009-0122260 A    11/2009
(Continued)

OTHER PUBLICATIONS

Notification of Reason for Refusal for Korean Application No. 10-2016-0027868, by Korean Intellectual Property Office, dated Mar. 22, 2017, 5 pages.
(Continued)

*Primary Examiner* — Richard A Booth
(74) *Attorney, Agent, or Firm* — Mintz Levin Cohn Ferris Glovsky and Popeo, P.C.; Steven M. Jensen; Joohee Lee

(57) ABSTRACT

The present invention relates to a passivation film deposition method for a light-emitting diode, comprising the steps of: depositing, on an upper part of a light-emitting diode of a substrate, a first passivation film having a silicon nitride (SiNx); and depositing, on an upper part of the first passivation film, a second passivation film having a silicon oxide (SiOx), wherein the ratio of the thickness of the first passivation film to the thickness of the second passivation film is 0.2-0.4:1.

6 Claims, 5 Drawing Sheets

THICKNESS RATIO OF FIRST PASSIVATION FILM TO SECOND PASSIVATION FILM

(56) References Cited

U.S. PATENT DOCUMENTS

2011/0100458 A1* 5/2011 Kang .................. B32B 15/08
136/259
2013/0247971 A1* 9/2013 Haas ................ H01L 31/02168
136/256

FOREIGN PATENT DOCUMENTS

| KR | 10-2011-0049477 A | | 5/2011 |
|----|-------------------|---|--------|
| KR | 10-2014-0087470 A | | 7/2014 |
| KR | 1020140087470 | * | 7/2014 |

OTHER PUBLICATIONS

First Office Action corresponding to Chinese Patent Application No. 201780015710.3 dated Aug. 1, 2019, 19 pages.

* cited by examiner (a)

(b)

PASSIVATION FILM DEPOSITION METHOD FOR LIGHT-EMITTING DIODE

CROSS-REFERENCE TO RELATED APPLICATIONS

This application is a continuation application of International Application No. PCT/KR2017/002470 filed on Mar. 7, 2017, which claims priority to Korean Application No. 10-2016-0027868 filed on Mar. 8, 2016. The applications are incorporated herein by reference.

TECHNICAL FIELD

The present invention relates to a method of depositing a passivation film of a light-emitting diode and, more particularly, to a method of depositing a passivation film, which provides an effect similarly to the prior art with a relatively small thickness compared with the prior art and also provides flexibility when a passivation film is deposited on a surface of a light-emitting diode via plasma enhanced chemical vapor deposition (PECVD).

BACKGROUND ART

Recently, with development of the information age, research has been actively conducted into a display device and, in particular, a light emitting diode (LED) display or an organic light emitting diode (OLED) has drawn attention.

Such an OLED uses an organic material that autonomously emits light and has distinctly different characteristics from a conventional liquid crystal display (LCD), a plasma display panel (PDP), or the like. In particular, a display device using an OLED is a next-generate display device and is known as a so-called bendable display and, recently, has also been widely used as a display of various portable devices such as a cellular phone, a smartphone, and a tablet personal computer (PC).

An OLED is a device that generates an electron-hole pair in a semiconductor from an electron and a hole and emits light through a recombination procedure of the electron-hole pair. Such an OLED is capable of expressing all the three primary colors of light at a relatively low driving voltage and is excellent to realize high resolution and natural color. It may be possible to produce a large-size display device with low expense and display devices advantageously have bendable characteristics and high response speed.

However, the above OLED includes a structure including an organic thin film and an electrode and, thus, has a problem in that the OLED is rapidly degraded when external moisture, oxygen, or the like penetrates thereinto. To overcome the problem, the OLED essentially needs a passivation film that blocks moisture and oxygen.

Recently, a method of forming a passivation film formed of an inorganic material as a multiple layer via atomic layer deposition (ALD) or plasma enhanced chemical vapor deposition (PECVD) has been developed.

However, ALD advantageously has a low water vapor transmission rate (WVTR) but has a problem in that it is difficult to realize a large area and, in particular, throughput is remarkably low.

Furthermore, a passivation film formed via PECVD has a problem in that flexible characteristics are degraded due to a relatively very large thickness. In addition, when the passivation film is deposited as a multiple layer, different layers are deposited and, thus, separate apparatuses for forming the respective layers are needed, thereby increasing manufacturing costs and further increasing manufacturing time.

SUMMARY

An object of the present invention is to provide a method of depositing a passivation film which shows an effect similarly to the prior art with a remarkably small thickness compared with the prior art to solve the aforementioned problem when depositing passivation film via plasma enhanced chemical vapor deposition (PECVD).

Another object of the present invention is to provide a method of depositing a passivation film applicable to a flexible display by providing a passivation film having flexible characteristics while having a low water vapor transmission rate (WVTR).

In addition, another object of the present invention is to provide a method of depositing passivation films by one apparatus when depositing a multi-layered passivation film.

The object of the present invention can be achieved by a method of depositing a passivation film, including depositing a first protection layer formed of silicon nitride (SiNx) on a light-emitting diode of a substrate, and depositing a second protection layer formed of silicon oxide (SiOx) on the first protection layer, wherein a ratio of a thickness of the first protection layer and a thickness of the second protection layer is 0.2 to 0.4:1.

Here, a total thickness of the passivation film including the first protection layer and the second protection layer may be 50 to 180 nm. In this case, the first protection layer may have a thickness of 10 to 40 nm and the second protection layer may have a thickness of 40 to 140 nm.

In the depositing of the first protection layer, silane (SiH4) gas may be supplied as precursor gas, $NH_3$ or $N_2$ may be supplied as reaction gas, and RF power density for plasma generation may have a value of 0.34 to 0.58 W/cm$^2$. In addition, in the depositing of the second protection layer, any one selected from an organic precursor group consisting of tetramethyl-disiloxane (TMDSO), hexaethyl-disilane (HEDS), hexamethyl-disiloxane (HMDSO), and bisdiethyl-amino-silane (BDEAS) may be supplied, $O_2$ or Ar may be supplied as a reaction gas, and RF power density for plasma generation may have a value of 0.63 to 0.87 W/cm$^2$.

The method may further include depositing a buffer layer on the second protection layer. In this case, the buffer layer may be formed of silicon oxide including carbon.

In this case, the depositing of the buffer layer and the depositing of the second protection layer may use the same organic precursor. Furthermore, the depositing of the buffer layer and the depositing of the second protection layer may be continuously performed.

As the depositing of the second protection layer proceeds to the depositing of the buffer layer, a supply amount of the reaction gas may be relatively reduced while a supply amount of the organic precursor is relatively increased.

The depositing of the first protection layer and the depositing of the second protection layer may be repeatedly performed to deposit a multi-layered passivation film.

According to a method of depositing a passivation film with the aforementioned configuration, while having a low water vapor transmission rate (WVTR) similarly to the prior art, it may be possible to deposit a passivation film having a remarkably small thickness compared with a conventional passivation film by depositing a passivation film including a silicon nitride layer and a silicon oxide layer via plasma enhanced chemical vapor deposition (PECVD).

A multi-layered passivation film including a first protection layer having low moisture transmissivity and a second protection layer with flexible characteristics may be provided and, thus, may be applicable to a flexible display device while preventing moisture and oxygen from penetrating as much as possible.

In addition, the first protection layer and the second protection layer may be deposited by the same apparatus and, thus, an installation area of a deposition apparatus may be remarkably reduced and, furthermore, processing time may be relatively reduced compared with the prior art.

DETAILED DESCRIPTION

Hereinafter, reference is made in detail to various embodiments, examples of which are illustrated in the accompanying drawings.

With regard to a structure of an organic light emitting diode (OLED), the OLED includes an injection-type thin film device manufactured with an emissive layer and a transport layer. Accordingly, the OLED is the same as an inorganic semiconductor in that they are a light-emitting diode using P-N junction but is different from a P-N junction-type light emitting diode (LED) in that the P-N junction-type LED is controlled by recombination via injection of minority carriers at a junction interface and the OLED is configured in such a way that all carriers involved in emitting light are injected from an external electrode. That is, a carrier injection-type light-emitting diode requires an organic material by which a carrier is easily injected and moved.

Figure 1:
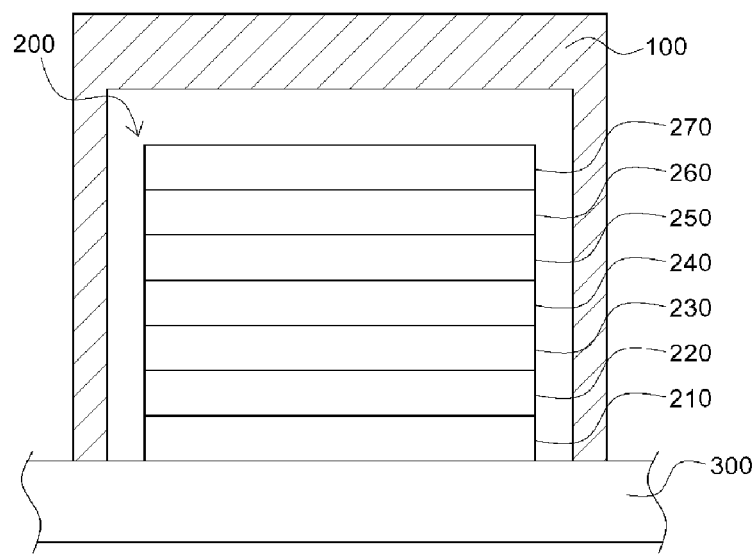
FIG. 1 is a schematic side cross-sectional view showing a structure of an organic light emitting diode (OLED).

FIG. 1 is a side cross-sectional view showing a structure of an OLED.

Referring to FIG. 1, an OLED 200 may include a stack structure including a substrate 300, an anode 210, a hole injection layer 220, a hole transport layer 230, an emissive layer 240, an electron transport layer 250, an electron injection layer 260, and a cathode 270 and may have a passivation film 100 disposed above the OLED 200. The structure of the OLED 200 is well known to the art to which the present invention pertains and, thus, a detailed description thereof is omitted here.

As described above, an OLED includes a structure including an organic thin film and an electrode and, thus, has a problem in that the OLED is rapidly degraded when external moisture, oxygen, or the like penetrates thereinto and, accordingly, to overcome the problem, the OLED needs a passivation film that blocks moisture and oxygen. In this case, the quality of the passivation film may be slightly different depending on sensitivity with respect to a contamination factor.

Recently, a method of forming a passivation film formed of an inorganic material as a multiple layer using an atomic layer deposition (ALD) or plasma enhanced chemical vapor deposition (PECVD) apparatus has been used. However, ALD advantageously has a low water vapor transmission rate (WVTR) but has a problem in that it is difficult to realize a large size and throughput is remarkably low. Furthermore, a passivation film formed via PECVD has a problem in that flexible characteristics are degraded due to a relatively very large thickness. In addition, when the passivation film is deposited as a multiple layer, different layers are deposited and, thus, separate apparatuses for forming the respective layers are needed, thereby increasing manufacturing costs and further increasing manufacturing time.

Accordingly, the present invention proposes a method of depositing a passivation film that has a relatively small thickness compared with the prior art, has a low WVTR value similarly to the prior art and, simultaneously, enhances throughput compared with the prior art. With reference to the drawings, the deposition method is now described.

Figure 2:
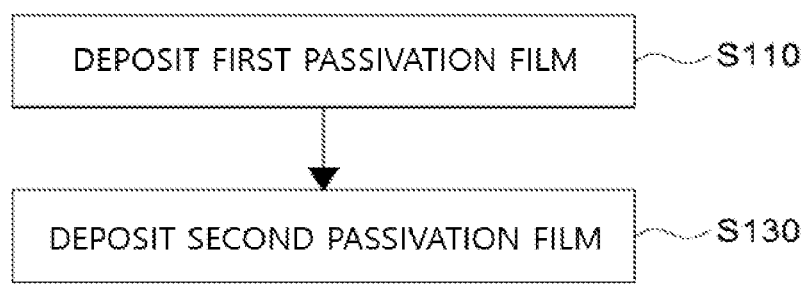
FIG. 2 is a flowchart showing a deposition procedure of a passivation film according to the present invention.
Figure 3:
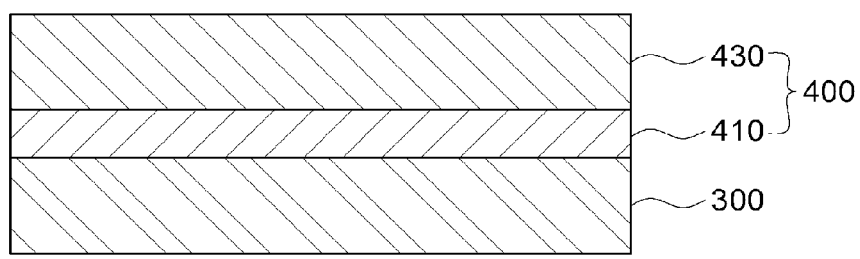
FIG. 3 is a cross-sectional view showing a passivation film according to an exemplary embodiment of the present invention.

FIG. 2 is a flowchart showing a deposition procedure of a passivation film according to the present invention. FIG. 3 is a cross-sectional view showing a passivation film according to an exemplary embodiment of the present invention. In FIG. 3, for convenience, a light-emitting diode is omitted and a passivation film is formed above a substrate.

Referring to FIGS. 2 and 3, the deposition procedure of the passivation film of a light-emitting diode according to the present invention may include depositing a first protection layer 410 above a light-emitting diode 200 of the substrate 300 (S 110) and depositing a second protection layer 430 above the first protection layer 410 (S 130).

According to the present invention, the first protection layer 410 and the second protection layer 430 may include an inorganic layer and may be deposited via plasma enhanced chemical vapor deposition (PECVD). According to the present exemplary embodiment, to effectively remove a pin hole or the like, which is to be generated during the deposition procedure of the passivation film, an inorganic layer including a multiple layer with two or more layers may be formed.

Here, the first protection layer 410 may include a silicon nitride (SiNx) layer with excellent resistance to penetration of oxygen and moisture and the second protection layer 430 may be formed of silicon oxide (SiOx) with excellent resistance to penetration of oxygen and moisture.

The first protection layer 410 may be deposited using precursor gas, for example, silane ($SiH_4$).

With regard to the characteristics of the first protection layer 410, oxygen and moisture transmittance is equal to or less than $5 \times 10$ g/$m^2$·day, a refractive index has a value of 1.82 to 1.85, and transmissivity in a visible ray range of 380 nm to 800 nm corresponds to 90% or more. Internal stress of the first protection layer 410 may have a value of −100 Mpa to +100 Mpa. According to the present exemplary embodiment, a thickness of the first protection layer 410 may be about 10 to 40 nm and, in this case, deposition speed of the first protection layer 410 may correspond to about 200 nm/min.

The second protection layer 430 formed of silicon oxide may be deposited using an organic precursor and, for example, the second protection layer may be deposited using any one selected from the organic precursor group consisting of tetramethyl-disiloxane (TMDSO), hexaethyl-disilane (HEDS), hexamethyl-disiloxane (HMDSO), and bisdiethyl-amino-silane (BDEAS).

With regard to the characteristics of the second protection layer 430, a refractive index has a value of 1.45 to 1.5 and transmissivity in a visible ray range of 380 nm to 800 nm corresponds to 95% or more. Internal stress of the second protection layer 430 may have a value of −100 Mpa to +100 Mpa. According to the present exemplary embodiment, a thickness of the second protection layer 430 may be about 40 to 140 nm and, in this case, deposition speed of the second protection layer 430 may correspond to about 150 nm/min.

With regard to the first protection layer 410 and the second protection layer 430, the first protection layer 410 formed of silicon nitride may have excellent characteristics as a passivation film, for example, characteristics characteristics such as a WVTR compared with the second protection layer 430 formed of silicon oxide but may have relatively low characteristics in terms of transmissivity. Accordingly, when a passivation film 400 of a light-emitting diode, including the first protection layer 410 formed of silicon nitride and the second protection layer 430 formed of silicon oxide, is deposited, a ratio of a thickness of the first protection layer 410 and a thickness of the second protection layer 430 may be about 0.2 to 0.4:1. That is, the first protection layer 410 may be formed with a relatively small thickness than the thickness of the second protection layer 430. In the case of the above structure, the passivation film 400 of the light-emitting diode may maintain the characteristics as a passivation film while maintaining transmissivity like in the prior art.

According to the present exemplary embodiment, a thickness of the passivation film 400 of the light-emitting diode, including the first protection layer 410 and the second protection layer 430, may be about 50 to 180 nm. Differently from the case in which a thickness of a passivation film deposited using a conventional chemical vapor deposition method is about 700 nm to 1000 nm, a passivation film deposited using the chemical vapor deposition method according to the present invention may achieve a similar effect to an effect according to the prior art while having a thickness of about ¼ to 1/20 of the thickness of the conventional passivation film.

This is because the light-emitting diode passivation film according to the present invention has a structure of a multiple layer formed of silicon nitride and silicon oxide and has a ratio of about 0.2 to 0.4:1 between the thickness of the first protection layer formed of silicon nitride and the thickness of the second protection layer formed of silicon oxide. That is, the first protection layer 410 formed of silicon nitride with a relatively small thickness may have relatively low transmissivity but may provide characteristics as a passivation film and the second protection layer 430 formed of silicon oxide with a relatively large thickness may provide characteristics of relatively high transmissivity.

In this case, as described above, according to the present exemplary embodiment, the thickness of the first protection layer 410 may be about 10 to 40 nm and the thickness of the second protection layer 430 may be about 40 to 140 nm.

Figure 4:
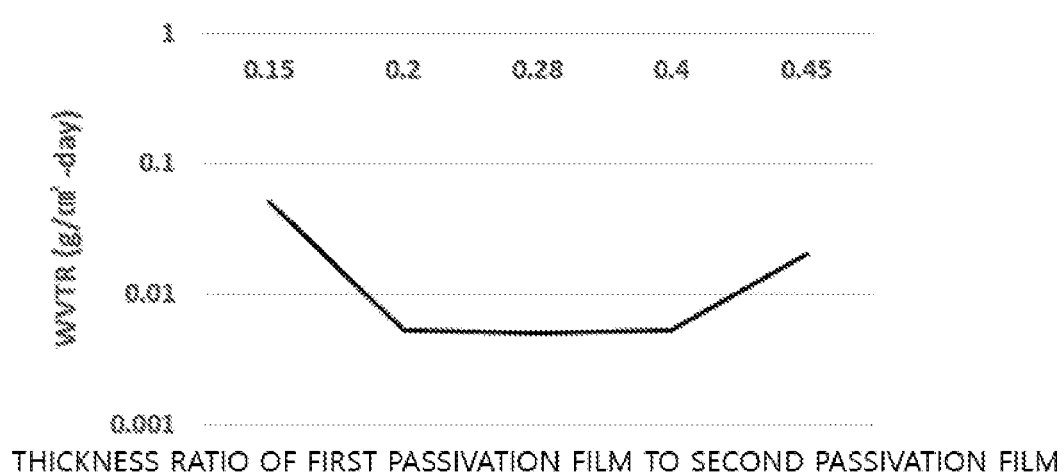
FIG. 4 is a graph showing a water vapor transmission rate (WVTR) value depending on a ratio of a thickness of a first protection layer to a thickness of a second protection layer.

The present applicant performs an experiment for comparison of a change in WVTR and visible ray transmissivity depending on a change in thickness ratio of the first protection layer 410 and the second protection layer 430 and, the experimental result is illustrated in FIG. 4. In FIG. 4, the horizontal axis refers to a thickness ratio of the first protection layer 410 to the thickness of the second protection layer 430 assuming that the thickness of the second protection layer 430 to be '1' and the vertical axis refers to a WVTR ($g/m^2$-day) of the passivation film.

As seen from FIG. 4, when a thickness ratio of the first protection layer 410 to the thickness of the second protection layer 430 is in the range of 0.2 to 0.4, the WVTR value may be about $5 \times 10^{-3}$ $g/m^2$-day and, on the other hand, when the thickness ratio is outside the range, the WVTR value may increase to about $2 \times 10^2$ $g/m^2$-day to about $5 \times 10^2$ $g/m^2$-day. That is, it may be seen that, when a thickness ratio of the first protection layer 410 to the thickness of the second protection layer 430 is outside 0.2 to 0.4, the WVTR value increases to about 4 times to 10 times or more. As a result, it may be seen that, when a thickness ratio of the first protection layer 410 to the second protection layer 430 is 0.2 to 0.4, which is a ratio according to the present invention, a WVTR value is relatively low.

As described above, when depositing a plurality of layers with different characteristics, if separate deposition apparatuses are required to stack the respective layers, a very large area is required due to the plurality of required deposition apparatuses. In addition, it is difficult to control a condition of a deposition procedure due to different processes in the deposition apparatuses and impurities may penetrate into a passivation film during moving between the deposition apparatuses. In addition, to deposit a plurality of layers to form a passivation film, remarkably long processing time may be required. Accordingly, in the passivation film deposition method according to the present invention, when a multi-layered passivation film is deposited, the multi-layered passivation film may be deposited by one apparatus. In this case, to distinguish between layers configuring the multi-layered passivation film, at least one of deposition conditions, for example, a type of precursor gas, precursor supply flow, reaction gas supply flow, and/or RF power may be changed.

As a result, a multi-layered passivation film may be deposited by one deposition apparatus, thereby reducing an installation area of entire apparatuses and processing time. Furthermore, by depositing two or more types of layers with different characteristics via a change in various different deposition conditions, a multi-layered passivation film that prevents impurities from penetrating thereinto and has flexibility may be provided.

In detail, the aforementioned first protection layer 410 and second protection layer 430 may be deposited in the same temperature range in the same chamber. That is, to deposit passivation films formed of silicon nitride and silicon oxide, the first protection layer 410 and the second protection layer 430 may be deposited by changing a type and/or flow rate of source gas and reaction gas for plasma generation while maintaining the same temperature range in the same chamber. Accordingly, both the first protection layer and the second protection layer are deposited in one chamber, thereby enhancing throughput. In particular, deposition is performed in the same temperature range to further enhance deposition efficiency.

For example, the first protection layer 410 may use precursor gas, for example, silane ($SiH_4$), may use deposition substrate temperature of about 80° C., and may use reaction gas of $NH_3$ or $N_2$. In this case, RF power density for plasma generation may be about 0.34 to 0.58 $W/cm^2$.

As described above, the second protection layer 430 may be deposited using any one selected from the organic precursor group consisting of tetramethyl-disiloxane (TMDSO), hexaethyl-disilane (HEDS), hexamethyl-disiloxane (HMDSO), and bisdiethylamino-silane (BDEAS). In this case, deposition substrate temperature may be about 80° C. similarly to the temperature of the first protection layer 410 and reaction gas may use $O_2$ or Ar. In this case, RF power density for plasma generation may be about 0.63 to 0.87 W/cm$^2$.

Figure 5:
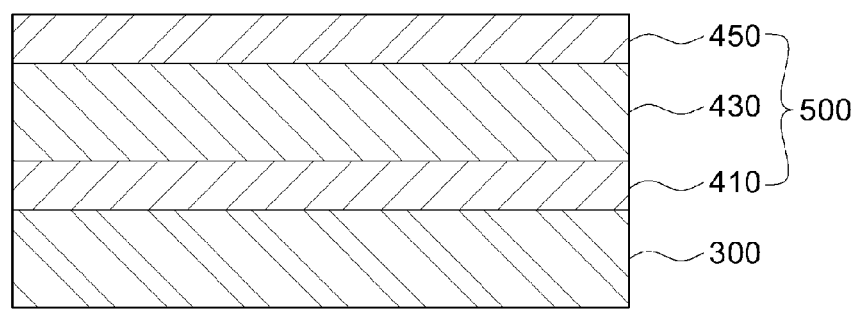
FIG. 5 is a cross-sectional view of a passivation film according to another exemplary embodiment of the present invention.

FIG. 5 is a cross-sectional view of a passivation film according to another exemplary embodiment of the present invention.

Referring to FIG. 5, a passivation film 500 of a light-emitting diode according to the present embodiment is different from the aforementioned embodiment in that the passivation film 500 further include a buffer layer 450 disposed on the second protection layer 430. The deposition procedure may further include depositing the buffer layer 450 on the second protection layer 430 subsequently to deposition of the second protection layer 430.

The buffer layer 450 may be formed of silicon oxide (SiOC) containing carbon and may cover particles, which may be generated during deposition, to prevent oxygen and moisture from penetrating and to alleviate defects generated on a surface and internal stress. In addition, the optical characteristics of the passivation film 500 of the light-emitting diode may be enhanced by adjusting the refractive index and thickness of the buffer layer 450.

In this case, the buffer layer 450 may be formed of silicon oxide deposited using a plasma enhanced chemical vapor deposition (PECVD) like the aforementioned first protection layer 410 and second protection layer 430.

In detail, the buffer layer 450 may be deposited using any one selected from the organic precursor group consisting of tetramethyl-disiloxane (TMDSO), hexaethyl-disilane (HEDS), hexamethyl-disiloxane (HMDSO), and bisdiethyl-amino-silane (BDEAS) similarly to the aforementioned second protection layer 430. Thin film stress of the buffer layer 450 may have a value of +50 Mpa at −50 Mpa and may have deposition speed equal to or greater than 250 nm/min.

According to the present embodiment, when the buffer layer 450 is deposited on the second protection layer 430, the buffer layer 450 may be deposited using an organic precursor of the second protection layer 430 without change of the organic precursor. That is, a silicon oxide layer included in the second protection layer 430 and the buffer layer 450 may be deposited by changing a gas amount, plasma power, process pressure, and so on using the same organic precursor.

Figure 6:
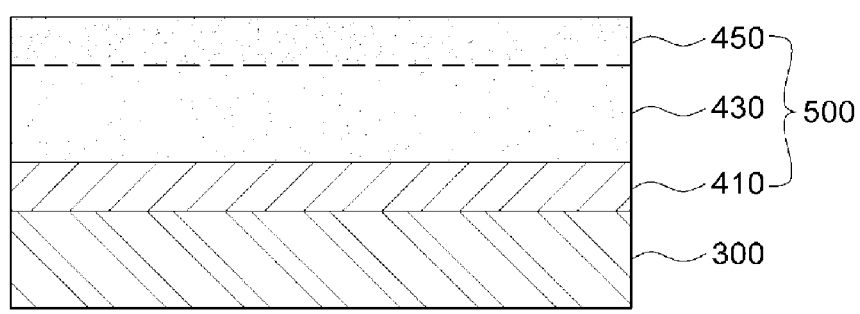
FIG. 6 is a cross-sectional view of a passivation film according to another exemplary embodiment of the present invention.

For example, the depositing of the buffer layer and the depositing of the second protection layer may be continuously performed while adjusting a supply amount of an organic precursor and/or reaction gas. FIG. 6 is a cross-sectional view illustrating a passivation film according to another exemplary embodiment of the present invention and schematically illustrates the passivation film formed by continuously performing the depositing of the buffer layer and the depositing of the second protection layer.

Referring to FIG. 6, as described above, the organic precursor may be formed using any one selected from the organic precursor group consisting of tetramethyl-disiloxane (TMDSO), hexaethyl-disilane (HEDS), hexamethyl-disiloxane (HMDSO), and bisdiethylamino-silane (BDEAS). That is, according to the present invention, an organic precursor may be supplied and reaction gas such as oxygen may be supplied to deposit the second protection layer 430 formed of silicon oxide and, furthermore, the gas amount may be adjusted to deposit the buffer layer 450 formed of the silicon oxide including carbon.

To supply the aforementioned organic precursor to deposit the second protection layer 430 formed of silicon oxide (SiOx), it may be important to remove a methyl group ($CH_3$) of an organic precursor. This is because, when methyl group ($CH_3$) is not sufficiently removed, a SiOC-based layer is formed.

Accordingly, when depositing the second protection layer formed of silicon oxide (SiOx) by supplying organic precursor, the supply amount of the aforementioned organic precursor may be reduced and the supply amount of the reaction gas may be relatively increased.

For example, when the second protection layer is deposited, deposition substrate temperature may be about 80° C., a supply amount of the organic precursor may be 40 to 50 sccm, a supply amount of 02 as a reaction gas may be about 1500 sccm, and a supply amount of Ar may be about 1500 sccm. In addition, RF power for plasma generation may be about 1300 W.

On the other hand, to deposit a buffer layer formed of silicon oxide including carbon (SiOC), a supply amount of the organic precursor may be relatively increased and a supply amount of reaction gas may be relatively reduced compared with the aforementioned case in which the second protection layer formed of a SiOx compound is deposited. When the buffer layer formed of the SiOC compound is deposited, it is not seriously required to remove a methyl group and, thus, it may not be required to reduce a supply amount of the organic precursor and, thus, a supply amount of reaction gas including oxygen or the like may be reduced.

For example, when the buffer layer is deposited, deposition substrate temperature may be about 80° C., a supply amount of the organic precursor may be about 120 to 130 sccm, a supply amount of $O_2$ as a reaction gas may be about 500 sccm, and a supply amount of Ar may be about 2500 sccm. RF power for plasma generation may be about 1300 W.

As a result, with regard to a procedure to the depositing of the buffer layer from the depositing of the second protection layer, it may be seen that a supply amount of the reaction gas is oppositely reduced while a supply amount of the organic precursor is increased.

Figure 7:
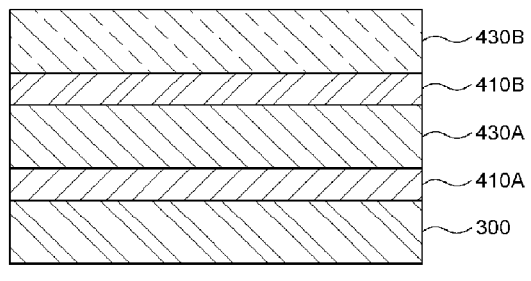
FIG. 7 is a cross-sectional view illustrating a passivation film according to various exemplary embodiments of the present invention.
Figure 7:
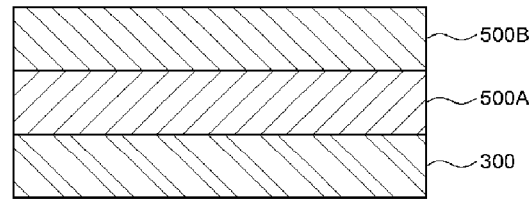

In this case, the second protection layer may prevent moisture from penetrating and the buffer layer may be configured to provide flexibility to a multi-layered passivation film. The passivation film formed of a SiOC compound may have a relatively high WVTR but may have excellent flexibility compared with the passivation film formed of a SiOx compound. Accordingly, by depositing the buffer layer on the second protection layer, it may be possible to deposit a flexible passivation film while preventing moisture from penetrating. FIG. 7 is a cross-sectional view illustrating a passivation film according to various exemplary embodiments of the present invention.

Referring to FIG. 7, with regard to the passivation film according to the present embodiment, a multi-layered passivation film may be deposited by repeatedly performing the aforementioned depositing of the first protection layer and the aforementioned depositing the second protection layer.

Referring to FIG. 7A, the passivation film may be formed with a total of four layers by depositing a first protection layer 410A and a second protection layer 430A and, then, re-depositing a first protection layer 410B and a second protection layer 430B. Such repetitive processes may be performed an appropriate number of times. Although not illustrated, it may be possible to deposit the aforementioned buffer layer on the uppermost layer on the passivation film illustrated in FIG. 7A.

FIG. 7B illustrates the case in which a plurality of passivation films 500A and 500B including the buffer layers 450 are formed at an upper portion like in FIG. 5 or 6 above. In this case, structures of the respective passivation films 500A and 500B, e.g., the number, thickness, order, and so on of the first protection layer 410 and the second protection layer 430 may be the same or at least one thereof may be different.

While the present invention has been shown and described in connection with the preferred embodiments, it will be apparent to those skilled in the art that modifications and variations can be made without departing from the spirit and scope of the invention as defined by the appended claims. Accordingly, when the modifications and variations include the components of claims, they are within the technological scope of the present invention.

INDUSTRIAL APPLICABILITY

According to the aforementioned method of depositing the passivation film having the above configuration, by depositing a passivation film including a silicon nitride layer and a silicon oxide layer via plasma enhanced chemical vapor deposition (PECVD) and, thus, it may be possible to deposit a passivation film that has a remarkably small thickness compared with a conventional passivation film while having a low WVTR similarly to the prior art.

A multi-layered passivation film including a first protection layer with low moisture transmissivity and a second protection layer with flexible characteristics may be provided and, thus, may be applicable to a flexible display device while preventing moisture and oxygen from penetrating as much as possible.

In addition, the first protection layer and the second protection layer may be deposited by the same apparatus and, thus, an installation area of a deposition apparatus may be remarkably reduced and, furthermore, manufacturing time may be relatively reduced compared with the prior art.

The invention claimed is:

1. A passivation film deposition method for a light-emitting diode, the method comprising:
   depositing a first protection layer formed of silicon nitride (SiNx) by plasma enhanced chemical vapor deposition (PECVD) on a light-emitting diode of a substrate;
   depositing a second protection layer formed of silicon oxide (SiOx) by plasma enhanced chemical vapor deposition (PECVD) on the first protection layer, and
   depositing a buffer layer formed of silicon oxide including carbon (SiOC) by plasma enhanced chemical vapor deposition (PECVD) on the second protection layer,
   wherein a ratio of a thickness of the first protection layer and a thickness of the second protection layer is 0.2 to 0.4:1,
   wherein, in the depositing of the second protection layer, any one selected from an organic precursor group consisting of tetramethyl-disiloxane (TMDSO), hexaethyl-disilane (HEDS), hexamethyl-disiloxane (HMDSO), and bisdiethylamino-silane (BDEAS) is supplied as a reaction gas, and
   wherein the depositing of the buffer layer and the depositing of the second protection layer use the same organic precursor and are continuously performed, and as the depositing of the second protection layer proceeds to the depositing of the buffer layer, a supply amount of the reaction gas is relatively reduced while a supply amount of the organic precursor is relatively increased.

2. The method of claim 1, wherein a total thickness of the passivation film including the first protection layer and the second protection layer is 50 to 180 nm.

3. The method of claim 2, wherein a thickness of the first protection layer is 10 to 40 nm and a thickness of the second protection layer is 40 to 140 nm.

4. The method of claim 1, wherein, in the depositing of the first protection layer, silane($SiH_4$) gas is supplied as precursor gas, $NH_3$ or $N_2$ is supplied as reaction gas, and RF power density for plasma generation has a value of 0.34 to 0.58 $W/cm^2$.

5. The method of claim 1, wherein, in the depositing of the second protection layer RF power density for plasma generation has a value of 0.63 to 0.87 $W/cm^2$.

6. The method of claim 1, wherein the depositing of the first protection layer and the depositing of the second protection layer are repeatedly performed to deposit a multi-layered passivation film.

* * * * *